(12) United States Patent
Karir et al.

(10) Patent No.: US 7,140,923 B2
(45) Date of Patent: Nov. 28, 2006

(54) MULTIPLE PORT ELECTRICAL CONNECTOR

(75) Inventors: Arvind Karir, Toronto (CA); Yuri Kuzyk, Uxbridge (CA); Roger John Lang, Endicott, NY (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 10/937,430

(22) Filed: Sep. 10, 2004

(65) Prior Publication Data

US 2006/0057896 A1     Mar. 16, 2006

(51) Int. Cl.
*H01R 24/00* (2006.01)
(52) U.S. Cl. ...................................... 439/676
(58) Field of Classification Search ................ 439/676, 439/638–639, 541.5, 941, 607
See application file for complete search history.

(56) References Cited

U.S. PATENT DOCUMENTS

| | | | |
|---|---|---|---|
| 4,650,933 A | 3/1987 | Benda et al. | |
| 4,747,790 A * | 5/1988 | Masuda et al. | 439/631 |
| 4,863,393 A * | 9/1989 | Ward et al. | 439/188 |
| 4,968,260 A * | 11/1990 | Ingalsbe | 439/76.1 |
| 4,975,067 A | 12/1990 | Bastijanic et al. | |
| 5,037,310 A | 8/1991 | Marinello | |
| 5,531,612 A * | 7/1996 | Goodall et al. | 439/541.5 |
| 5,704,794 A | 1/1998 | Lindeman | |
| 5,822,855 A | 10/1998 | Szczesny et al. | |
| 6,176,743 B1 | 1/2001 | Kuo | |
| 6,210,236 B1 | 4/2001 | Kan | |
| 6,227,911 B1 | 5/2001 | Boutros et al. | |
| 6,343,957 B1 | 2/2002 | Kuo et al. | |
| 6,413,120 B1 * | 7/2002 | Winings et al. | 439/676 |
| 6,582,244 B1 | 6/2003 | Fogg et al. | |
| 6,633,490 B1 | 10/2003 | Centola et al. | |
| 6,663,437 B1 * | 12/2003 | Korsunsky et al. | 439/676 |
| 6,764,343 B1 | 7/2004 | Ferentz | |

\* cited by examiner

*Primary Examiner*—J. F. Duverne
(74) *Attorney, Agent, or Firm*—Blank Rome LLP

(57) ABSTRACT

An electrical connector that has a housing including a connecting interface adapted to connect with a mating electrical connector. A plurality of first contacts are coupled to the connecting interface. Each of the first contacts include opposite first and second end sections, and a plurality of second contacts coupled to the connecting interface. Each of the second contacts include opposite first and second end sections. The first end sections of the first contacts being axially aligned with the first end sections of the second contacts, and the second end sections of the first contacts being laterally offset from the second end sections of the second contacts.

29 Claims, 3 Drawing Sheets

MULTIPLE PORT ELECTRICAL CONNECTOR

FIELD OF THE INVENTION

The present invention relates to an electrical connector for high density connection of data cables. More specifically, the electrical connector of the present invention has improved performance, and is both compact and includes multiple ports for data connection.

BACKGROUND OF THE INVENTION

Systems for connecting data cables generally include standardized racks and panels, such as 1RU or 2RU high panels, supporting multiple separate electrical connections to accommodate the data cables. Typically, the electrical connections are provided by modular plugs and jacks, presently standardized as the RJ-45 connection system. There is also a large connector, the RJ-21, which has several ports. Multiple separate connections are required due to the speed of the data, the need to reduce EMI radiation, and the need to minimize cross-talk between adjacent lines in the same connector.

Conventional jacks either provide only a single port, i.e. 8 contacts, of connection or are bulky and therefore are incapable of terminating the required density of ports within the space of a 1RU panel. In addition, increases in the data speed and the new requirements of carrying power over Ethernet networks requires higher connector performance not provided by the conventional jacks. A need exists for a connector with improved electrical performance and a higher density of interconnects within a 1RU panel. The existing designs cannot accommodate the required components for higher performance, such as magnetic cores for safety isolation.

Examples of conventional connection systems and connectors include U.S. Pat. No. 6,764,343 to Ferentz; U.S. Pat. No. 6,582,244 to Fogg et al.; U.S. Pat. No. 6,343,957 to Kuo et al.; U.S. Pat. No. 6,227,911 to Boutros et al.; U.S. Pat. No. 6,210,236 to Kan; U.S. Pat. No. 6,176,743 to Kuo; and U.S. Pat. No. 5,704,794 to Lindman, the subject matter of each of which is incorporated by reference in their entirety.

SUMMARY OF THE INVENTION

Accordingly, an object of the present invention is to provide an electrical connector with improved electrical performance and a higher density of interconnects within a 1RU panel.

Another object of the present invention is to provide an electrical connector that integrates components, such as multiple circuit boards and magnetic packages, to improve performance.

Yet another object of the present invention is to provide an electrical connector with multiple ports and that fits a 1RU panel.

The foregoing objects are basically attained by an electrical connector that has a housing including a connecting interface adapted to connect with a mating electrical connector, a plurality of first contacts coupled to the connecting interface, each of the first contacts including opposite first and second end sections, and a plurality of second contacts coupled to the connecting interface, each of the second contacts including opposite first and second end sections, the first end sections of the first contacts being axially aligned with the first end sections of the second contacts, and the second end sections of the first contacts being laterally offset from the second end sections of the second contacts.

The foregoing objects are also attained by an electrical connector that has a housing including a connecting interface adapted to connect with a mating electrical connector, a first set of contacts connected to and extending from the connecting interface, a second set of contacts connected to and extending from the connecting interface, a first circuit board having opposite first and second side surfaces, the first set of contacts being connected to the first circuit board, and a second circuit board separate from the first circuit board having opposite first and second sides, the second set of contacts being connected to the second circuit board.

Other objects, advantages and salient features of the invention will become apparent from the following detailed description, which, taken in conjunction with the annexed drawings, discloses a preferred embodiment of the present invention

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
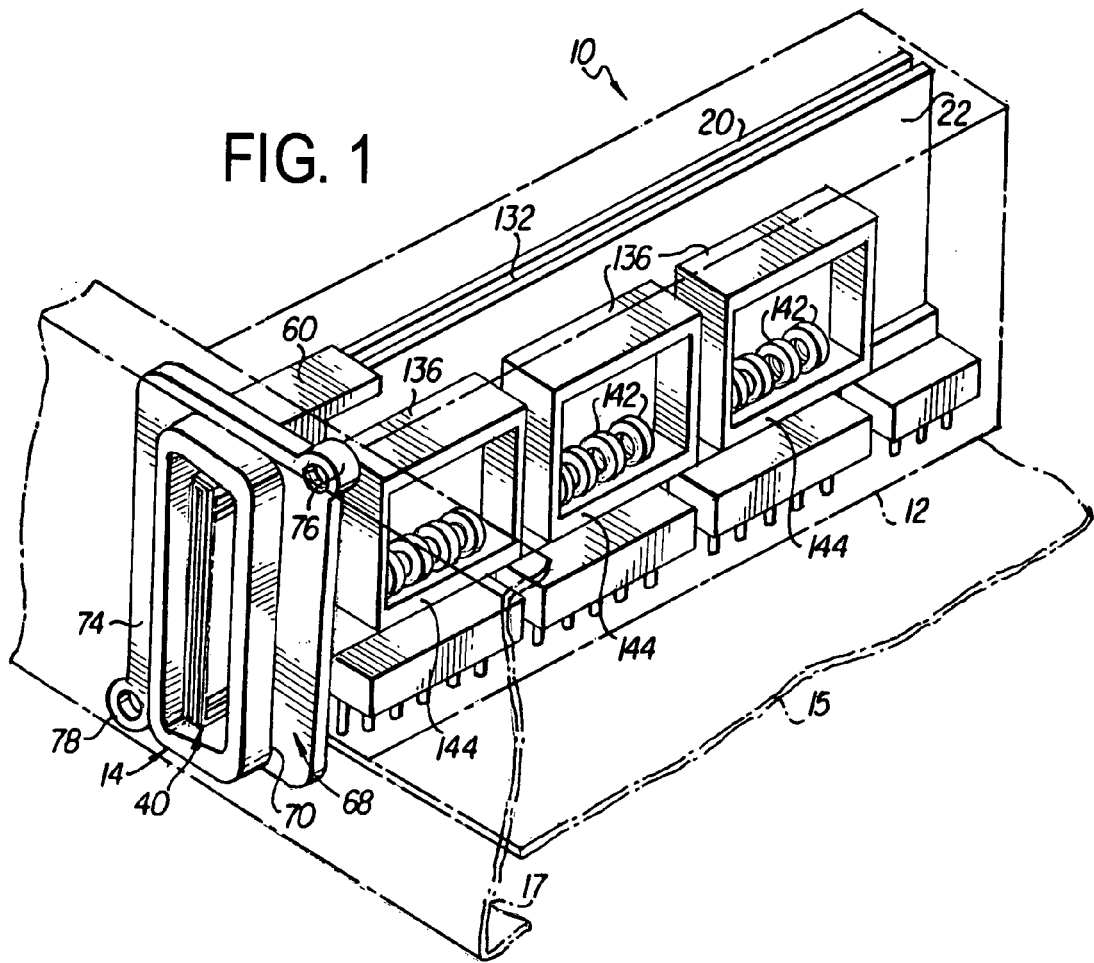
FIG. 1 is a perspective view of the electrical connector in accordance with the present invention.

Referring to FIGS. 1–8, a multiport electrical connector 10 for a high-density data interconnection system, in accordance with the present invention, generally includes a housing 12, and a connecting interface 14 having multiple sets of interleaved contacts 16 and 18 (FIG. 2) connected to two printed circuit boards 20 and 22. Electrical connector 10 is preferably a plug connector that is connected to a user's main printed circuit board 15 (FIG. 1). However, the invention can be applied to a receptacle conductor as well. The interleaving sets of contacts 16 and 18 provide electrical connector 10 with multiple ports (i.e. more than 16 contacts) allowing a higher density of ports per 1RU panel. Connector 10 is also mounted to a support panel 17, such as a 1RU metal face plate. Using two circuit boards 20 and 22 facilitates the layout and routing of the signal pathways inside connector 10. As a result, electrical connector 10 includes multiple ports, is more compact, and has increased performance over conventional high-density electrical connectors.

Figure 3:
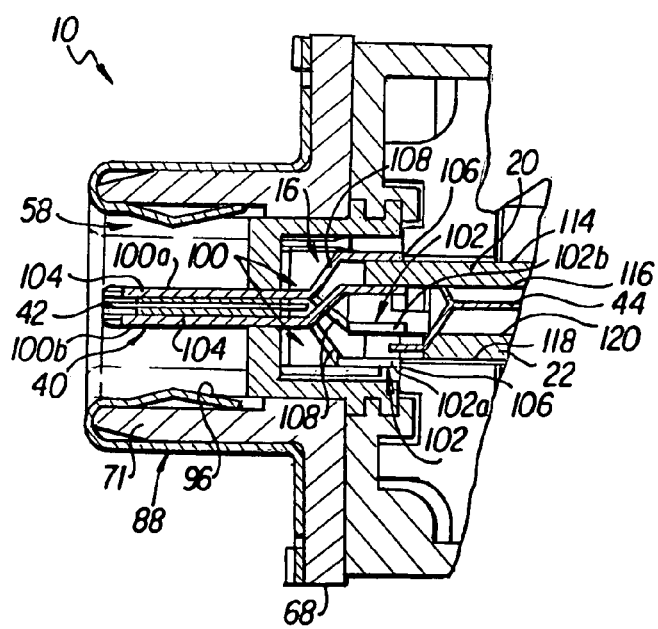
FIG. 3 is a partial top plan view in section of the electrical connector illustrated in FIG. 1, showing a connecting interface with contacts connected to first and second circuit boards of the electrical connector.

Connecting interface 14 includes a dielectric body 26 having first, second and third side walls 28, 30 and 32 extending between first and second end walls 34 and 36. Body 26 defines an outer shoulder 38. A plug portion 40 extends from body 26 away from third side wall 32, as seen in FIG. 3. Contacts 16 and 18 extend through body 26 into plug portion 40. A first center ground plane 42 is disposed in plug portion 40 between contacts 16 and 18 and a second center ground plane 44 is disposed between circuit boards 20 and 22, as seen in FIG. 3. First and second center ground planes 42 and 44 provide cross talk isolation and improve electrical performance. Preferably, each center ground planes 42 and 44 is a thin sheet of metal that electrically isolates contacts 16 and 18 and boards 20 and 22 by shielding them from each other's electrical and magnetic fields, thereby increasing electrical performance.

Figure 2:
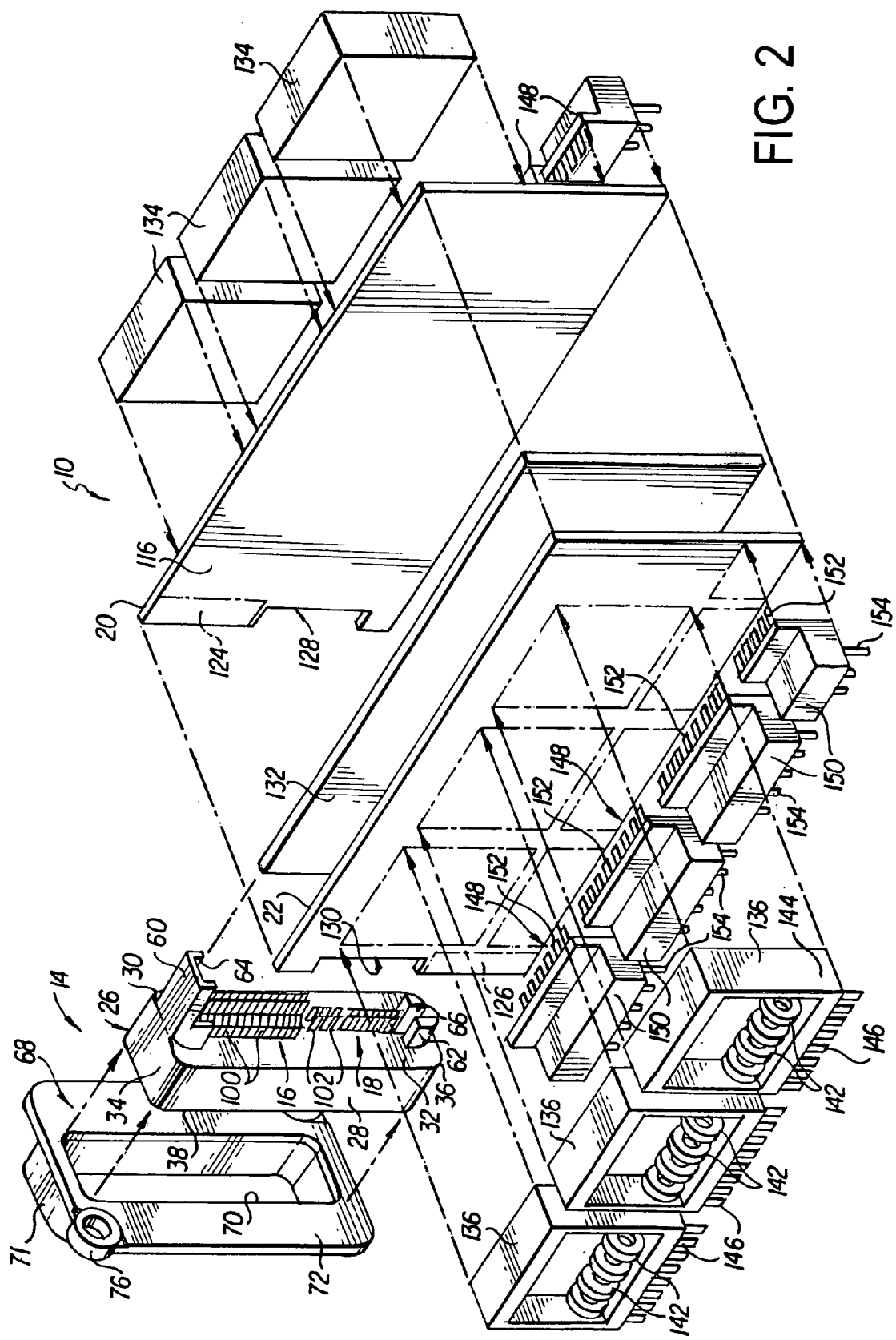
FIG. 2 is an exploded perspective view of the electrical connector illustrated in FIG. 1.
Figure 5:
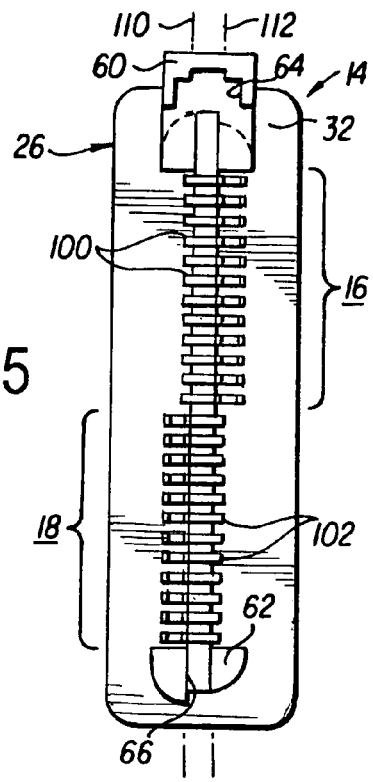
FIG. 5 is a rear elevational view of the connecting interface of the electrical connector illustrated in FIG. 1, showing the contacts extending in different directions.
Figure 6:
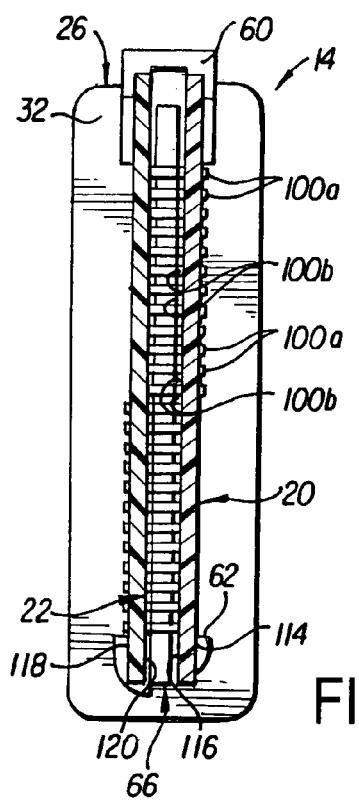
FIG. 6 is a rear elevational view similar to FIG. 5 of the connecting interface, showing the first and second circuit boards connected to the contacts.

As seen in FIGS. 2 and 6, third side wall 32 of body 26 includes first and second flanges 60 and 62 extending therefrom opposite plug portion 40. The first and second flanges 60 and 62 are near first and second end walls 34 and 36 of body 26, respectively. First flange 60 is longer than second flange 62 and is generally C-shaped in cross section, thereby defining a groove 64 that receives first and second circuit boards 20 and 22, as seen in FIGS. 5 and 6. Second flange 62 is substantially aligned with first flange 60 and includes a central slot 66 that receives first and second circuit boards 20 and 22.

As seen in FIGS. 1 and 2, a frame member 68 with a center aperture 70 and extension shoulder 71 snugly fits around outer shoulder 38 of body 26. An opening 58 is defined around plug portion 40 and frame 68 for a receiving an interface of a mating electrical connector (not shown), such as a corresponding receptacle. The back surface 72 of frame 68 is adjacent first and second flanges 60 and 62. The back surface 72 and the front surface 74 of frame 68 are substantially flat and extension shoulder 71 is shaped to accommodate body outer shoulder 38. At least first and second threaded mounting holes 76 and 78 are disposed at opposite corners of frame 68. Mounting holes 76 and 78 facilitate mounting connector 10 to support panel 17 (FIG. 1), and also facilitate mounting the mating electrical connector (not shown). Frame 68 is preferably diecast and formed of metal to provide mechanical support to body 26 and provides shielding to improve the EMC (electromagnetic compatability) performance of connector 10. Bumps or protrusions (not shown) can also be provided on front surface 74 of frame 68 that engage the support panel 17 to increase EMC performance.

Figure 7:
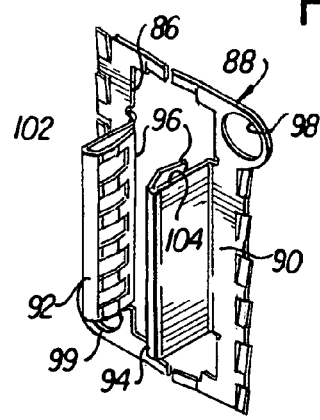
FIG. 7 is a perspective view of an optional clip for the electrical connector illustrated in FIG. 1.
Figure 8:
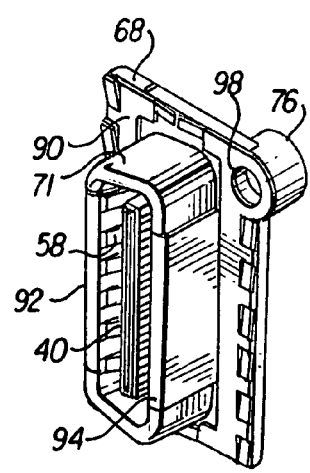
FIG. 8 is a perspective view of the connecting interface and supporting frame of the electrical connector illustrated in FIG. 1, showing the clip mounted to the interface and frame.

A clip 88, made of a conductive material, can be incorporated into frame 68, as best seen in FIGS. 3, 7 and 8. Clip 88 includes a plate portion 90 corresponding to front surface 74 of frame 68 and first and second arm portions 92 and 94 extending from a central aperture 86 of plate portion 90. Clip 88 rests on frame front surface 74 and clip plate portion 90 includes holes 98 and 99 that align with mounting holes 76 and 78 of frame 68. Each arm portion 92 and 94 of clip 88 includes spring fingers 96 with first and second slots 102 and 104 being defined between first arm portion 92 and fingers 96 and second arm portion 94 and fingers 96, respectively. The extension shoulder 71 of frame 68 fits into first and second slots of clip 88 defined between spring fingers 96 and first and second arm portions 92 and 94. Spring fingers 96 extend into opening 58 around plug portion 40, as seen in FIGS. 3 and 8. Fingers 96 increase EMC performance by providing a superior contact area between plug portion 40 of connector 10 and the interface of the mating electrical connector. Fingers 96 also compensate for manufacturing tolerance gaps between plug portion 40 and the mating electrical connector without interfering with the connection between connector 10 and the mating electrical connector. Fingers 96 can also increase EMC performance by contacting the support panel 17 to seal off any cut-outs in the panel 17 where connecting interface 14 of connector 10 is supported in panel 17.

First and second sets of interleaved contacts 16 and 18 extend from third side wall 32 of connecting interface 14, as best seen in FIGS. 2, 3 and 5. The sets of contacts 16 and 18 are interleaved, that is they extend in different directions to allow the first set of contacts 16 to engage traces on one of the circuit boards 20 and 22 and the second set of contacts 18 to engage traces on the other of the circuit boards 20 and 22, as seen in FIG. 3. Each set of contacts 16 and 18 includes multiple contacts 100 and 102, respectively. Each of the contacts 100 and 102 have first and second end sections 104 and 106 and a middle section 108 angled between the end sections 104 and 106. The first end sections 104 of the contacts 100 and 102 are connected to connecting interface body 26. More specifically, each first end section 104 extends into plug portion 40 of connecting interface 14, as seen in FIG. 3. The second end sections 106 of contacts 100 and 102 connect to either first or second circuit boards 20 and 22.

The first and second sets of contacts 16 and 18 are interleaved, i.e. extend in different directions, to allow the contacts to engage both circuit boards 20 and 22, thereby facilitating signal routing to both circuit boards 20 and 22. In particular, the middle angled sections 108 of contacts 100 of the first set of contacts 16 extend toward first circuit board 20 and the middle angled sections 108 of contacts 102 of the second set of contacts 18 extend toward the second circuit board 22, thereby allowing the end sections 106 of contacts 100 and 102 to engage circuit boards 20 and 22, respectively. Thus, the middle angled sections 108 of contacts 100 and 102, respectively, extend away from one another in different directions, such that the second end sections 106 of contacts 100 and 102, respectively, will be laterally offset.

As seen in FIGS. 3–6, contacts 100 and 102 of first and second sets of contacts 16 and 18, respectively, are arranged in parallel pairs. The first end sections 104 of the pairs of contacts 100 and 102 of sets 16 and 18 are aligned along respective axes 110 and 112, as seen in FIG. 5. Each pair of contacts 100 of the first set of contacts 16 connect to first circuit board 20 and each pair of contacts 102 of the second set of contacts 18 connect to second circuit board 22. More specifically, one contact 100a of the pairs of contacts 100 connects at its end section 106 to a first or outer surface 114 of first circuit board 20 and the other contact 100b of the pairs of contacts 100 connects at its end section 106 to a second or inner surface 116 of circuit board 20, as best seen in FIG. 3. Similarly, one contact 102a of the pairs of contacts 102 connects at its end section 106 to a first or outer surface 118 of second circuit board 22 and the other contact 102b of the pairs of contacts 102 connects at its end section 106 to a second or inner surface 120 of circuit board 22.

Figure 4:
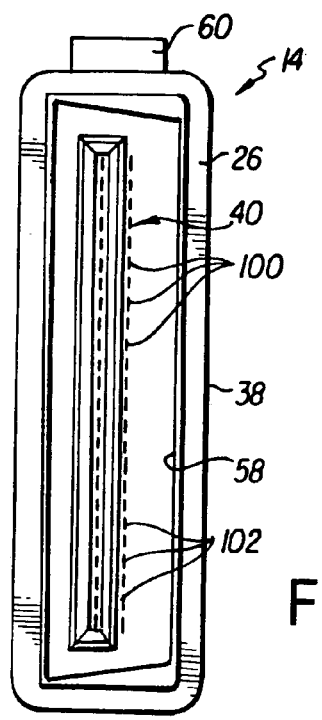
FIG. 4 is a front elevational view of the connecting interface of the electrical connector illustrated in FIG. 1.

Each set of contacts 16 and 18 includes at least four pairs of the contacts 100 or 102, thereby defining at least one port (i.e. 8 contacts) for each set of contacts 16 and 18. As illustrated in FIGS. 4 and 5, each set of contacts 16 and 18 includes 12 pairs of contacts 100 and 102, respectively, or 3 ports (i.e. 24 contacts). However, any number of contacts 100 and 102 can be included in the sets of contacts 16 and 18 to provide any desired number of ports for connector 10. Also, any number of sets of contacts can be included with connecting interface 14. For example, a third set of contacts can be added to first and second sets 16 and 18. The third set of contacts could extend in either direction, that is toward first or second circuit board 20 and 22.

First set of contacts 16 connects to outer and inner surfaces 114 and 116 of first circuit board 20 at area 124 (FIG. 1), preferably by soldering. Area 124 is generally an upper corner of board 20. Second set of contacts 18 connects to outer and inner surfaces 118 and 120 of second circuit board 22 at area 126, which is generally a lower corner of board 22. As seen in FIG. 2, first and second circuit boards 20 and 22 include cut-out sections 128 and 130, respectively. Cut-out section 128 of first circuit board 20 is aligned with and faces area 126 of second circuit board 22. Likewise, cut-out section 130 of second circuit board 22 is aligned with and faces area 124 of first circuit board 20. Cut-out section 130 of second circuit board 22 allows access to area 124 of first circuit board 20, thereby allowing a visual inspection of the connection of contacts 100 to first circuit board 20. Cut-out section 128 of first circuit board 20 allows access to area 126 of second circuit board 22 to allow visual inspection of the connection of contacts 102 to second circuit board 22. Between first and second circuit boards 20 and 22, a spacer plate 132 is provided that is composed of any type of EMI shielding material. Spacer plate 132 is thicker than boards 20 and 22 and generally the same length without covering cut-out sections 128 and 130 of boards 20 and 22. Spacer plate 132 electrically isolates the two circuit boards 20 and 22 to improve performance. The spacer plate 132 can include a slot for retaining the center ground plane 45 to provide additional shielding.

As seen in FIGS. 1 and 2, in a preferred embodiment, first and second sets of magnetic packages 134 and 136 are connected to the outer surfaces 114 and 118 of first and second circuit boards 20 and 22, respectively, to provide safety isolation and filtering of signal interference. Each set of magnetic packages 134 and 136 preferably includes 3 magnetic packages, respectively, but can include any number of packages including a single package. Each magnetic package 134 and 136 includes a plurality of toroidal ferrite cores 142 wound with wire placed within a plastic housing 144. The wires of the cores 142 are connected to posts 146 by, e.g., soldering, which form leads that are connected to a respective circuit board 20 or 22. Preferably magnetic packages 134 and 136 and their leads 146 are oriented vertically with respect to circuit boards 20 and 22, as seen in FIGS. 1 and 2, to allow easier signal routing to the circuit boards 20 and 22. Since two circuit boards 20 and 22 are utilized in connector 10, multiple magnetic packages 134 and 136 can be integrated in a compact manner. Electrical connectors 148 are provided to complete the data path and provide electrical continuity from the output leads 146 of the magnetic packages 134 and 136 to the user's main circuit board 15. In particular, each connector 148 includes a dielectric body 150 with a first set of metal leads 152 connected to one of the circuit boards 20 and 22 and a second set of metal leads 154 connected to the user's circuit board.

By designing connector 10 as described above, connector 10 can be both made compact and provide multiple ports per IRU panel by utilizing more than one circuit board and interleaving contacts connected to the boards. This arrangement also improves signal routing and allows magnetic packages to be incorporated into the connector, thereby improving performance.

While a particular embodiment has been chosen to illustrate the invention, it will be understood by those skilled in the art that various changes and modification can be made therein without departing from the scope of the invention as defined in the appended claims.

What is claimed is:

1. An electrical connector, comprising:
   a housing including a connecting interface;
   a plurality of first contacts coupled to said connecting interface, each of said first contacts including opposite first and second end sections; and
   a plurality of second contacts coupled to said connecting interface, each of said second contacts including opposite first and second end sections, said first end sections of said first contacts being axially aligned with said first end sections of said second contacts, and said second end sections of said first and second contacts being axially offset from said first end sections of said first and second contacts.

2. An electrical connector according to claim 1, wherein each of said first and second contacts includes an angled middle section extending between said first and second end sections.

3. An electrical connector according to claim 1, wherein said plurality of first contacts includes at least 8 contacts; and
   said plurality of second contacts includes at least 8 contacts.

4. An electrical connector according to claim 1, wherein said first contacts are connected to a first circuit board.

5. An electrical connector according to claim 4, wherein said second contacts are connected to a second circuit board.

6. An electrical connector according to claim 4, wherein at least one magnetic package is connected to said first circuit board.

7. An electrical connector according to claim 1, wherein said connecting interface is a plug interface; and
   said mating electrical connector is a receptacle adapted to mate with said plug interface.

8. An electrical connector, comprising:
   a housing including a connecting interface;
   a first set of contacts connected to and extending from said connecting interface;
   a second set of contacts connected to and extending from said connecting interface;
   each contact of each of said first and second sets of contacts includes opposite first and second end sections and an angled middle section extending therebetween;
   a first circuit board having opposite first and second side surfaces, said first set of contacts being connected to said first and second side surfaces of said first circuit board; and
   a second circuit board separate from said first circuit board having opposite first and second sides, said second set of contacts being connected to said first and second side surface of said second circuit board.

9. An electrical connector according to claim 8, wherein said first set of contacts are interleaved with said second set of contacts.

10. An electrical connector according to claim 8, wherein said first set of contacts includes pairs of spaced, substantially parallel contacts; and said second set of contacts includes pairs of spaced, substantially parallel contacts.

11. An electrical connector according to claim 10, wherein each of said first and second sets of contacts includes at least 4 pairs of contacts.

12. An electrical connector according to claim 8, wherein
said first set of contacts are connected to both of said first and second side surfaces of said first circuit board; and
said second set of contacts are connected to both of said first and second side surfaces of said second circuit board.

13. An electrical connector according to claim 8, wherein said first and second circuit boards are spaced and substantially parallel.

14. An electrical connector according to claim 13, wherein
a conductive spacer plate is disposed between said first and second circuit boards.

15. An electrical connector according to claim 13, wherein
said first and second circuit boards include first and second cut-out sections, respectively;
said first cut-out section is located on said first circuit board across from and aligned with said second set of contacts connected to said second circuit board; and
said second cut-out section is located on said second circuit board across from and aligned with said first set of contacts connected to said first circuit board.

16. An electrical connector according to claim 8, wherein
said connecting interface is a plug interface; and
said mating electrical connector is a receptacle adapted to mate with said plug interface.

17. An electrical connector according to claim 16, wherein
said housing includes a diecast frame surrounding said plug interface.

18. An electrical connector according to claim 17, wherein
said connecting interface includes a shoulder snugly fit into said frame.

19. An electrical connector according to claim 17, wherein
said frame includes a clip with spring fingers extending into said connecting interface.

20. An electrical connector according to claim 17, wherein
said diecast frame includes threaded bores for mounting said housing.

21. An electrical connector according to claim 8, wherein
a conductive center ground plane is disposed between said first and second circuit boards.

22. An electrical connector, comprising:
a housing including a connecting interface;
a first set of contacts connected to and extending from said connecting interface;
a second set of contacts connected to and extending from said connecting interface;
each contact of said first set of contacts includes opposite first and second end sections;
each contact of said second set of contacts includes opposite first and second end sections;
said first end sections of said first and second sets of contacts being axially aligned;
said second end sections of said first and second sets of contacts, respectively, being axially offset from said respective first end sections;
a first circuit board having opposite first and second side surfaces, said first set of contacts being connected to said first circuit board; and
a second circuit board spaced and substantially parallel to said first circuit board having opposite first and second sides, said second set of contacts being connected to said second circuit board.

23. An electrical connector according to claim 22, wherein
a conductive spacer plate is disposed between said first and second circuit boards.

24. An electrical connector according to claim 22, wherein
said first and second circuit boards include first and second cut-out sections, respectively;
said first cut-out section is located on said first circuit board across from and aligned with said second set of contacts connected to said second circuit board; and
said second cut-out section is located on said second circuit board across from and aligned with said first set of contacts connected to said first circuit board.

25. An electrical connector according to claim 22, wherein each of said contacts of said first and second sets of contacts are soldered to said first and second circuit boards, respectively.

26. An electrical connector according to claim 8, wherein each of said contacts of said first and second sets of contacts are soldered to said first and second circuit boards, respectively.

27. An electrical connector, comprising:
a housing including a connecting interface;
a first set of contacts connected to and extending from said connecting interface;
a second set of contacts connected to and extending from said connecting interface;
a first circuit board having opposite first and second side surfaces, said first set of contacts being connected to said first and second side surfaces of said first circuit board;
a second circuit board separate from said first circuit board having opposite first and second sides, said second set of contacts being connected to said first and second side surface of said second circuit board, said first and second circuit boards being spaced and substantially parallel, wherein
said first and second circuit boards include first and second cut-out sections, respectively,
said first cut-out section being located on said first circuit board across from and aligned with said second set of contacts connected to said second circuit board, and
said second cut-out section being located on said second circuit board across from and aligned with said first set of contacts connected to said first circuit board.

28. An electrical connector, comprising:
a housing including a connecting interface;
a first set of contacts connected to and extending from said connecting interface;
a second set of contacts connected to and extending from said connecting interface;
a first circuit board having opposite first and second side surfaces, said first set of contacts being connected to said first and second side surfaces of said first circuit board;
a second circuit board separate from said first circuit board having opposite first and second sides, said second set of contacts being connected to said first and second side surface of said second circuit board; and a conductive center ground plane being disposed between said first and second circuit boards.

29. An electrical connector, comprising:

a housing including a connecting interface;

a first set of contacts connected to and extending from said connecting interface;

a second set of contacts connected to and extending from said connecting interface;

a first circuit board having opposite first and second side surfaces, said first set of contacts being connected to said first circuit board; and a second circuit board spaced and substantially parallel to said first circuit board having opposite first and second sides, said second set of contacts being connected to said second circuit board, wherein said first and second circuit boards include first and second cut-out sections, respectively, said first cut-out section being located on said first circuit board across from and aligned with said second set of contacts connected to said second circuit board, and said second cut-out section being located on said second circuit board across from and aligned with said first set of contacts connected to said first circuit board.

* * * * *

UNITED STATES PATENT AND TRADEMARK OFFICE
CERTIFICATE OF CORRECTION

PATENT NO.         : 7,140,923 B2
APPLICATION NO. : 10/937430
DATED                 : November 28, 2006
INVENTOR(S)       : Arvind Karir et al.

It is certified that error appears in the above-identified patent and that said Letters Patent is hereby corrected as shown below:

Col. 2, line 18, after "invention" insert a period --.--.

Col. 5, line 66, change "IRU" to --1RU--.

Signed and Sealed this

Thirty-first Day of July, 2007

JON W. DUDAS
*Director of the United States Patent and Trademark Office*